(12) United States Patent
Koradia et al.

(10) Patent No.: US 6,352,441 B2
(45) Date of Patent: *Mar. 5, 2002

(54) LOCKING SPRING FOR A CIRCUIT BOARD EJECTOR

(75) Inventors: Amir Koradia, Palatine; Philip A. Ravlin, Bartlett; Douglas J. Pogatetz, Arlington Heights, all of IL (US)

(73) Assignee: 3Com Corporation, Rolling Meadows, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/372,488

(22) Filed: Aug. 12, 1999

(51) Int. Cl.[7] ............................................. H01R 13/62
(52) U.S. Cl. ..................................................... 439/160
(58) Field of Search ................................. 439/157, 160, 439/372

(56) References Cited

U.S. PATENT DOCUMENTS

| | | | |
|---|---|---|---|
| 4,319,733 A | * 3/1982 | Hanna et al. | 248/507 |
| 4,579,408 A | * 4/1986 | Sasaki | 339/45 |
| 4,931,907 A | * 6/1990 | Robinson et al. | 361/391 |
| 5,017,149 A | * 5/1991 | Hatanaka | 439/157 |
| 5,211,568 A | * 5/1993 | Yamada et al. | 439/157 |
| 5,232,374 A | * 8/1993 | Lino | 439/157 |
| 5,387,115 A | * 2/1995 | Kaoel et al. | 439/157 |
| 5,647,755 A | * 7/1997 | Hida et al. | 439/328 |
| 5,690,499 A | * 11/1997 | Howell et al. | 439/157 |
| 5,741,150 A | * 4/1998 | Stinson et al. | 439/358 |
| 5,766,031 A | * 6/1998 | Yeh | 439/328 |
| 5,897,393 A | * 4/1999 | Haftmann | 439/495 |
| 5,928,010 A | * 7/1999 | Katsuma et al. | 439/157 |
| 5,941,726 A | * 8/1999 | Koegel et al. | 439/358 |
| 5,989,043 A | * 11/1999 | Han et al. | 439/157 |
| 6,030,239 A | * 2/2000 | Liu | 439/160 |
| 6,113,404 A | * 9/2000 | Choy | 439/160 |
| 6,132,228 A | * 10/2000 | Lang | 439/160 |

* cited by examiner

Primary Examiner—Brian Sircus
Assistant Examiner—Thanh-Tam Le
(74) Attorney, Agent, or Firm—Baniak, Pine & Gannon

(57) ABSTRACT

A locking spring for a circuit board ejector includes a body portion, a first end portion and a second end portion. The second end portion includes a manually operable portion. The manually operable portion includes a plurality of ridge portions to allow a user to apply a load to the manually operable portion at an optimum location along the manually operable portion to unlock a circuit board ejector.

13 Claims, 2 Drawing Sheets

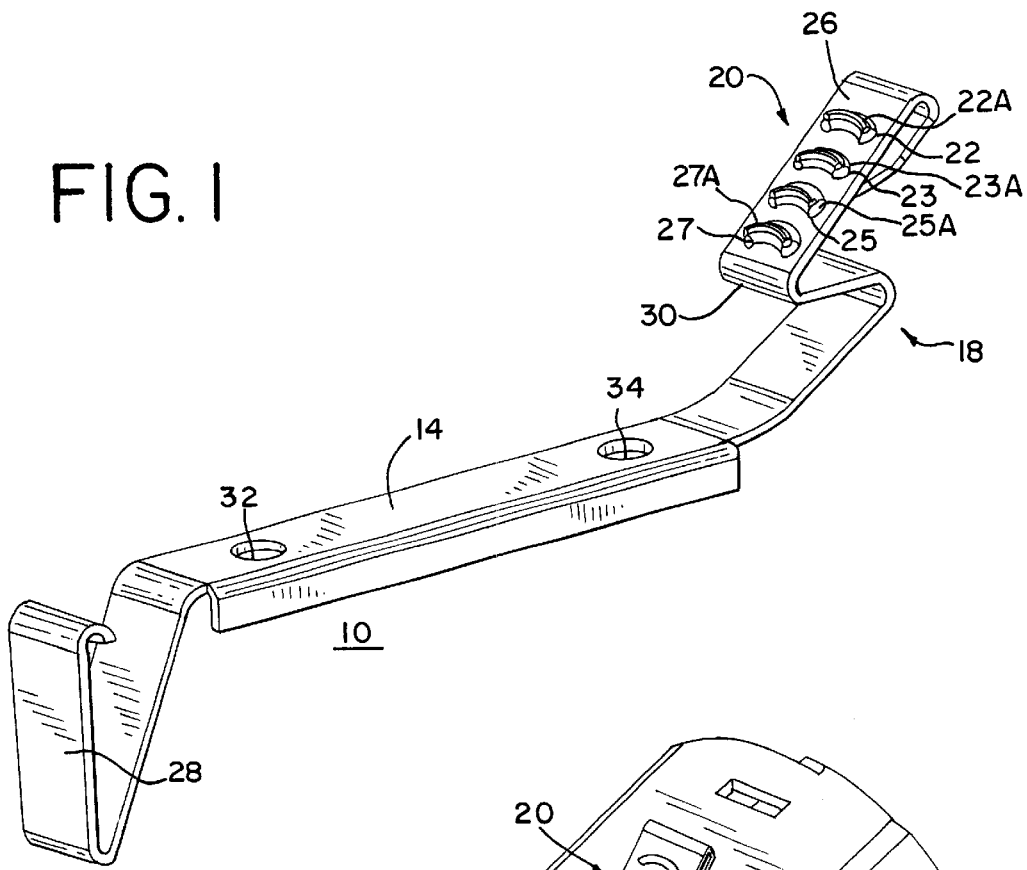
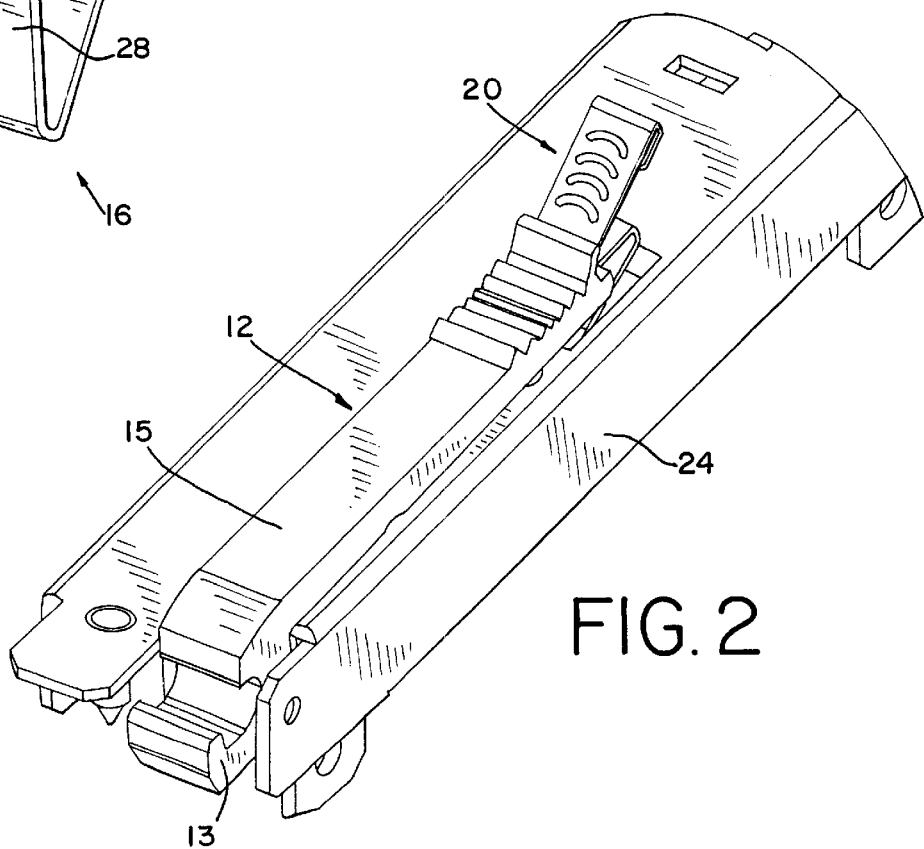

LOCKING SPRING FOR A CIRCUIT BOARD EJECTOR

FIELD OF THE INVENTION

This invention relates generally to the field of circuit board ejectors used for mounting a circuit board to an electronic chassis, and in particular, to a locking spring for a circuit board ejector.

BACKGROUND OF THE INVENTION

An electronic chassis which houses electronic components for high speed telecommunication and networking applications typically includes a plurality of vertically oriented circuit board assemblies that are inserted into the chassis. Each circuit board assembly is typically comprised of a circuit board attached to a U-shaped channel member that serves as a front faceplate of the assembly. When the assembly is fully inserted, the circuit board is connected to a backplane circuit board located along the backside of the chassis. The insertion force required to connect the circuit board to the backplane may make it difficult, if not impossible, for a user to make the connection by manually forcing the channel member in a direction towards the backplane.

In order to facilitate the connection of the circuit board to the backplane, attempts have been made to provide a mechanical connector at each end of the channel member, each mechanical connector having a handle portion and a hook portion. The mechanical connectors are typically rotatably attached to each end of the channel member and are able to rotate freely about a pin that is attached to the channel member. When installing the circuit board assembly, a user typically orients each hook portion to allow each hook portion to engage a flange portion of the chassis. After each hook portion engages the flange portion, the handle portion of each mechanical connector is then manually rotated about the pin, which forces the circuit board into the backplane. When the circuit board is fully inserted and the handle portion is completely rotated, the handle portion is secured relative to the channel member in a locked position.

Attempts have been made to provide a mechanical means to retain the handle portion in the locked position. For example, mechanical fasteners such as screws or bolts have been used to ensure that the channel member of the circuit board assembly is firmly secured to the electronic chassis. However, there are increased manufacturing costs associated with the large number of fastening components that are typically required to secure numerous circuit board assemblies to the chassis. Moreover, these fastening components require close tolerances which also increases manufacturing costs and increases the amount of time required to install and remove the circuit board from the electronic chassis. Finally, tools are required with conventional fasteners, which also increases installation and removal times.

Attempts have been made to provide springs formed from thin planar strips of metal to retain the handle portion in the locked position. The spring is typically attached to the channel member, and is configured so that an end portion of the spring engages the handle portion to lock the handle portion in place. When the user desires to unlock the handle portion, the user applies a load to the end portion of the spring, which releases the handle portion from the spring. However, conventional springs typically have a smooth surface along its outer surface. When a user applies a load to the smooth outer surface of the end portion of the spring to unlock the handle portion, the smooth surface may cause the user's fingers to slip off the spring during actuation of the spring. Moreover, the spring typically does not have a designated area along its outer surface to provide the optimum location for the user's fingers to make contact with the spring. As a result, a user may apply a load to the spring at a location that is not optimum to cause movement of the spring. This in turn may result in greater loads having to be applied to the spring making unlocking the handle portion more difficult, if not impossible.

Accordingly, it would be desirable to have a locking spring for a circuit board ejector that overcomes the disadvantages described above.

SUMMARY OF THE INVENTION

One aspect of the invention provides a locking spring for a circuit board ejector including a body portion, a first end portion and a second end portion. The second end portion includes a manually operable portion. The manually operable portion includes a plurality of ridge portions to allow a user to apply a load to the manually operable portion at an optimum location along the manually operable portion to unlock a circuit board ejector. Each of the plurality of ridge portions may preferably extend outward from an outer surface of the manually operable portion. In particular, each of the plurality of ridge portions may preferably extend outward the same distance from the outer surface of the manually operable portion. Each of the plurality of ridge portions may preferably have an arcuate surface. The first end portion may preferably include a contact surface for contacting the circuit board ejector. The circuit board ejector may preferably include a hook portion, and the contact surface may preferably contact the hook portion of the circuit board ejector. The second end portion of the locking spring may further include a latch portion to engage the circuit board ejector. The latch portion may preferably be adjacent to the manually operable portion. The body portion may preferably include at least one opening formed therein to allow the body portion to be fastened to a bracket member. The locking spring may preferably be comprised from a single piece of rigid material such as metal or plastic.

Another aspect of the invention provides a locking spring for a circuit board ejector including a body portion, a first end portion and a second end portion. The first end portion includes a contact surface for contacting a circuit board ejector. The second end portion includes a manually operable portion. The manually operable portion includes a plurality of ridge portions to allow a user to apply a load to the manually operable portion at an optimum location along the manually operable portion to unlock the circuit board ejector.

Another aspect of the invention provides a method of operating a locking spring for a circuit board ejector. A body portion, a first end portion and a second end portion are provided. The second end portion includes a manually operable portion having a plurality of ridge portions. A load is applied to the manually operable portion. The circuit board ejector may preferably be operatively connected to the locking spring, and the circuit board ejector may preferably be unlocked.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

BRIEF DESCRIPTION OF THE DRAWINGS

FIG. 1 is a perspective view of a preferred embodiment of a locking spring that is made in accordance with the invention;

FIG. 2 is a perspective view showing locking spring of FIG. 1 mounted to a bracket member with a circuit board ejector in the locked position;

DETAILED DESCRIPTION OF THE PRESENTLY PREFERRED EMBODIMENTS

Figure 3:
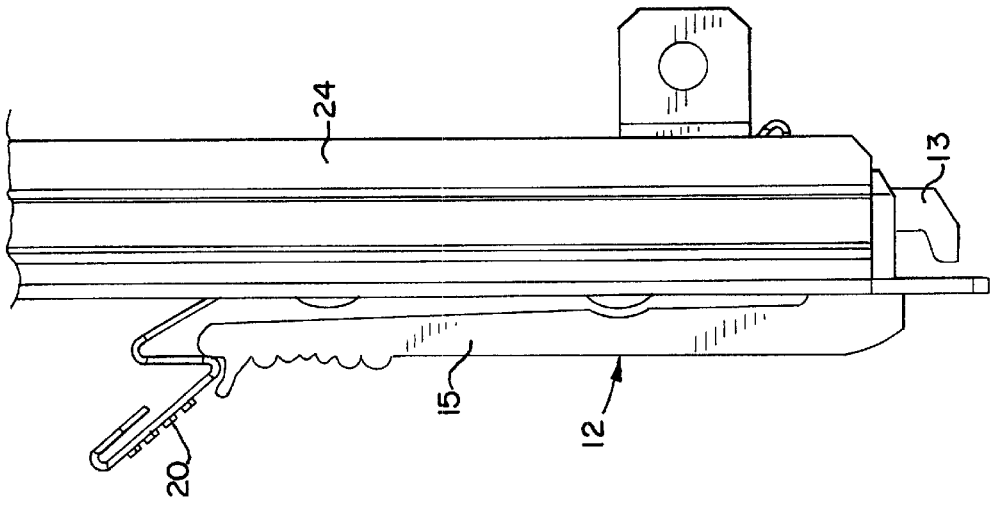
FIG. 3 is an enlarged side view of the embodiment of FIG. 2.
Figure 4:
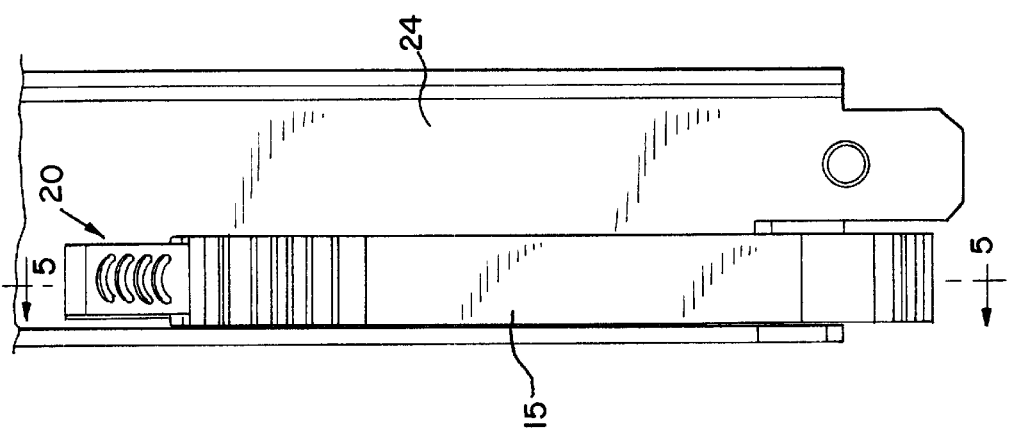
FIG. 4 is an enlarged front view of the embodiment of FIG. 2.
Figure 5:
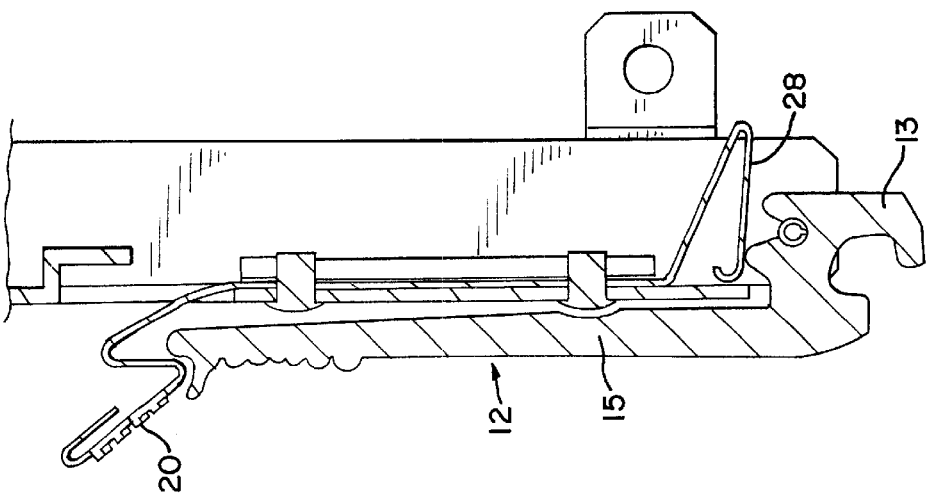
FIG. 5 is a sectional view taken along line 5—5 of FIG. 4.

As shown in FIG. 1, a preferred embodiment of a locking spring 10 for a circuit board ejector 12 (see FIGS. 2–5) includes a body portion 14, a first end portion 16 and a second end portion 18. The second end portion 18 includes a manually operable portion 20. The manually operable portion 20 includes a plurality of ridge portions 22, 23, 25, 27. The locking spring 10 shown in FIG. 1 allows a user to apply a load to the manually operable portion 20 at an optimum location along the manually operable portion 20 to unlock the circuit board ejector 12 (see FIGS. 2–5).

As shown in FIGS. 2–3, the circuit board ejector 12 includes a hook portion 13 and a handle portion 15. The circuit board ejector 12 is rotatably attached to a bracket member 24, which in turn is operatively attached to a circuit board (not shown). The circuit board ejector 12 facilitates the insertion of a circuit board into an electronic chassis. A preferred embodiment of a circuit board ejector and its operation is described in U.S. patent application Ser. No. 09/144,830, the entire disclosure of which is incorporated herein by reference.

Referring again to FIG. 1, each of the plurality or ridge portions 22, 23, 25, 27 of the second end portion 18 of the locking spring 10 may preferably extend outward from an outer surface 26 of the manually operable portion 20. In the embodiment shown, for example, each of the plurality of ridge portions 22, 23, 25, 27 may preferably extend outward the same distance from the outer surface 26 of the manually operable portion 20. In addition, each of the plurality of ridge potions 22, 23, 25, 27 may also preferably have an arcuate surface 22A, 23A, 25A, 27A, respectively, to facilitate contact of an operator's finger with the manually operable portion 20 of the second end portion 18 of the locking spring 10. However, the plurality of ridge portions 22, 23, 25, 27 may preferably have other configurations and shapes depending upon the particular application. The plurality of ridge portions 22, 23, 25, 27 provides a fixed location for a user to contact the manually operable portion 20 of the locking spring 10. As a result, the plurality of ridge portions 22, 23, 25, 27 allow a user to quickly and easily apply a load to the locking spring 10 at the optimum location along manually operable portion 20 of the locking spring 10. The plurality of ridge portions 22, 23, 25, 27 also prevents a user's finger from slipping off the manually operable portion 20 of the locking spring 10 when a user depresses the manually operable portion 20 of the locking spring 10.

The first end portion 16 of the locking spring 10 may preferably include a contact surface 28 for contacting the circuit board ejector 12. In the embodiment shown in FIGS. 2–5, for example, the contact surface 28 of the first end portion 16 may preferably contact the hook portion 13 of the circuit board ejector 12.

The second end portion 18 of the locking spring 10 may also preferably include a latch portion 30 to engage the circuit board ejector 12. In the embodiment shown, the latch portion 30 may preferably be adjacent to the manually operable portion 20.

The body portion 14 of the locking spring 10 may preferably include at least one opening 32 formed therein to allow the body portion 14 to be fastened to the bracket member 24. In the embodiment shown, a second opening 34 is provided, although the number of openings may vary depending upon the particular application.

In the embodiment shown in FIG. 1, the locking spring 10 may preferably be approximately 3 inches in length and 0.312 inches in width. Alternatively, the locking spring 10 may have other dimensions depending upon the particular application. The locking spring 10 may preferably be comprised from a single piece of rigid material. The rigid material may be, for example, aluminum or any other suitable metallic material. For example, the locking spring 10 may preferably be manufactured from metal such as, for example, stainless steel, beryllium copper, or any other suitable material that can function as a spring. Alternatively, the locking spring 10 may preferably be comprised of any other suitable rigid material such as, for example, plastic. The plurality of ridge portions 22, 23, 25, 27 may preferably be integrally formed with the locking spring 10. For example, the plurality of ridge portions 22, 23, 25, 27 may preferably be stamped into the manually operable portion 20 of the locking spring 10 during the fabrication process. An advantage of this arrangement is the elimination of discrete components for the plurality of ridge portions 22, 23, 25, 27, which results in reduced manufacturing costs.

As shown in FIGS. 2–5, the body portion 14 of the locking spring 10 is operatively attached to the bracket member 24. Conventional mechanical fasteners such as, for example, rivets, screws, bolts, and nuts may be used to attach the body portion 14 to the bracket member 24. Alternatively, other conventional means may be used to fasten the locking spring 10 to the bracket member 24 including, for example, adhesives or spot welding. The handle portion 15 of the circuit board ejector 12 may preferably be retained in a locked position by the latch portion 30 of the locking spring 10. In operation, a user may apply a load to the manually operable portion 20 of the locking spring 10. When the manually operable portion 20 is deflected by the load, the latch portion 30 of the locking spring 10 separates from the handle portion 15 of the circuit board ejector 12 thereby unlocking the circuit board ejector 12.

While the embodiments of the invention disclosed herein are presently considered to be preferred, various changes and modifications can be made without departing from the spirit and scope of the invention. The scope of the invention is indicated in the appended claims and all changes that come within the meaning and range of equivalents are intended to be embraced therein.

We claim:

1. A locking spring for a circuit board ejector comprising:
   a body portion, a first end portion and a second end portion, the second end portion including a protruding portion which is adapted to be received in a recess formed at a free end of the circuit board ejector, the second end portion including a manually operable portion, the manually operable portion including an outer planar surface, the manually operable portion further including a plurality of raised ridge portions extending outward from the outer planar surface of the manually operable portion and spaced apart along the outer planar surface wherein each of the plurality of ridge portions include a curved body portion, the curved body portion extending outward from the outer planar surface of the manually operable portion, the curved body portion following an arc-shaped course along the outer planar surface to allow a user to apply a load to the manually operable portion at an optimum location along the manually operable portion to unlock the circuit board ejector.

2. The apparatus of claim 1 wherein each of the plurality of raised ridge portions extends outward from the planar surface of the manually operable portion the same distance.

3. The apparatus of claim 1 wherein the first end portion includes a contact surface for contacting the circuit board ejector.

4. The apparatus of claim 3 wherein the circuit board ejector includes a hook portion, the contact surface contacting the hook portion of the circuit board ejector.

5. The apparatus of claim 1 wherein the second end portion further includes a latch portion to engage the circuit board ejector.

6. The apparatus of claim 5 wherein the latch portion is adjacent to the manually operable portion.

7. The apparatus of claim 1 wherein the body portion includes at least one opening formed therein to allow the body portion to be fastened to a bracket member.

8. The apparatus of claim 1 wherein the locking spring is comprised from a single piece of flexible material.

9. The apparatus of claim 8 wherein the locking spring is comprised of metal.

10. The apparatus of claim 8 wherein the locking spring is comprised of plastic.

11. A locking spring for a circuit board ejector comprising:

a body portion, a first end portion and a second end portion, the first end portion including a contact surface for contacting the circuit board ejector, the second end portion including a protruding portion which is adapted to be received in a recess formed at a free end of the circuit board ejector, the second end portion including a manually operable portion, the manually operable portion including an outer planar surface, the manually operable portion further including a plurality of raised ridge portions extending outward from the outer planar surface of the manually operable portion and spaced apart along the outer planar surface wherein each of the plurality of ridge portions include a curved body portion, the curved body portion extending outward from the outer planar surface of the manually operable portion, the curved body portion following an arc-shaped course along the outer planar surface to allow a user to apply a load to the manually operable portion at an optimum location along the manually operable portion to unlock the circuit board ejector.

12. A method of operating a locking spring for a circuit board ejector comprising:

providing a body portion, a first end portion and a second end portion, the second end portion including a protruding portion which is adapted to be received in a recess formed at a free end of the circuit board ejector, the second end portion including a manually operable portion, the manually operable portion including an outer planar surface, the manually operable portion further including a plurality of raised ridge portions extending outward from the outer planar surface of the manually operable portion and spaced apart along the outer planar surface wherein each of the plurality of ridge portions include a curved body portion, the curved body portion extending outward from the outer planar surface of the manually operable portion, the curved body portion following an arc-shaped course along the outer planar surface; and applying a load to the manually operable portion.

13. A The method of claim 12 wherein the circuit board ejector is operatively secured to the locking spring and further comprising:

unlocking the circuit board ejector.

* * * * *

UNITED STATES PATENT AND TRADEMARK OFFICE
CERTIFICATE OF CORRECTION

PATENT NO.   : 6,352,441 B2                                                Page 1 of 1
DATED        : March 5, 2002
INVENTOR(S)  : Amir Koradia, Philip A. Ravlin and Douglas J. Pogatetz It is certified that error appears in the above-identified patent and that said Letters Patent is hereby corrected as shown below:

<u>Title page,</u>
Item [56], U.S. PATENT DOCUMENTS, change "Kaoel" to -- Kozel --.

Signed and Sealed this

Twenty-ninth Day of April, 2003

JAMES E. ROGAN
*Director of the United States Patent and Trademark Office*